United States Patent [19]

Butt

[11] Patent Number: 5,014,159
[45] Date of Patent: May 7, 1991

[54] SEMICONDUCTOR PACKAGE

[75] Inventor: Sheldon H. Butt, Godfrey, Ill.

[73] Assignee: Olin Corporation, New Haven, Conn.

[21] Appl. No.: 332,912

[22] Filed: Apr. 4, 1989

Related U.S. Application Data

[60] Division of Ser. No. 643,530, Aug. 23, 1984, which is a continuation of Ser. No. 390,081, Jun. 21, 1982, which is a continuation-in-part of Ser. No. 369,785, Apr. 19, 1982, abandoned.

[51] Int. Cl.$^5$ ................................................ H05H 7/20
[52] U.S. Cl. .................................... 361/386; 174/16.3; 361/389
[58] Field of Search .................... 174/16.3; 357/70, 81; 361/386, 389, 421, 414

[56] References Cited

U.S. PATENT DOCUMENTS 3,165,672  1/1965  Gellert .
3,296,099  1/1967  Dinella .
3,341,369  9/1967  Caule et al. .

(List continued on next page.)

FOREIGN PATENT DOCUMENTS 0057085   8/1982  European Pat. Off. .
1907567   9/1969  Fed. Rep. of Germany .
2269793  11/1975  France .
2381388   9/1978  France .
0090566  10/1983  Japan .
2010013   6/1979  United Kingdom .
2074793  11/1981  United Kingdom .

OTHER PUBLICATIONS

"Clad Metal Circuit Board Substrates for Direct Mounting of Ceramic Chip Carrier", by Dance and Wallace, First Annual Conference of the International Electronics Packaging Society, Cleveland, OH, 1981.
"Use of Metal Core Substrates for Leadless Chip Carrier Interconnection", by Lassen, Electronic Packaging and Production, Mar. 1981, pp. 98-104.
"Chip-Carriers, Pin-Grid Arrays Change the PC- Board Landscane", by Lyman.
Nutter et al., Center-Post Heat Sink, IBM Tech. Disc. Bull., vol. #9, Feb. 1981, pp. 4222 and 4223 relied on copy in 174/16 HS.
Burry et al., Multidirectional Expansion Packaging, IBM Tech. Disc. Bull., vol. 19, #8, Jan. 1977, pp. 2960 relied on copy.
Betz et al., Monolithic Chip Carrier, IBM Tech. Disc. Bull., vol. 9, #11, Apr. 1967, p. 1511 relied on copy in 174/52 FP.
Electronics, Dec. 29, 1981, pp. 65-75.
Chip Carriers: Coming Force in Packaging, by Erickson, Electronic Packaging and Production, Mar. 1981, pp. 64-80.

Primary Examiner—Gregory D. Thompson
Attorney, Agent, or Firm—Gregory S. Rosenblatt; Paul Weinstein

[57] ABSTRACT

A semiconductor package for mounting a chip is disclosed. The package includes a first metal or metal alloy component having a first thin refractory oxide layer on a first surface. The chip is bonded to the first component. A skirt extends from the first component for strengthening the first component and providing heat transfer from the semiconductor package. A second metal or metal alloy lead frame having second and third refractory oxide layers on opposite surfaces is electrically connected to the chip and is bonded to the first oxide layer. Also, the lead frame is insulated from the first component by the first and second refractory oxide layers. A second metal or metal alloy component has a fourth refractory oxide layer on one surface and is bonded to the third refractory oxide layer so that the chip is hermetically sealed between the first and second components. Other embodiments of the present invention include both leadless and leaded hermetic semiconductor packages and innovative relationships between the packages and printed circuit boards.

10 Claims, 3 Drawing Sheets

U.S. PATENT DOCUMENTS

| Number | Date | Name |
|---|---|---|
| 3,435,127 | 3/1969 | Rose . |
| 3,475,227 | 10/1969 | Caule et al. . |
| 3,480,836 | 11/1969 | Aronstein . |
| 3,495,021 | 2/1970 | Hessinger . |
| 3,546,363 | 12/1970 | Pryor et al. . |
| 3,611,046 | 10/1971 | Covert . |
| 3,618,203 | 11/1971 | Pryor . |
| 3,676,292 | 7/1972 | Pryor et al. . |
| 3,676,569 | 7/1972 | Thompson . |
| 3,676,748 | 7/1972 | Kobayashi et al. . |
| 3,684,818 | 8/1972 | Netherwood . |
| 3,698,964 | 10/1972 | Caule et al. . |
| 3,714,370 | 1/1973 | Nixen et al. . |
| 3,726,987 | 4/1973 | Pryor et al. . |
| 3,730,779 | 5/1973 | Caule et al. . |
| 3,762,039 | 10/1973 | Douglass et al. . |
| 3,801,728 | 4/1974 | Gallo, Jr. et al. . |
| 3,810,754 | 5/1974 | Ford et al. . |
| 3,826,627 | 7/1974 | Pryor et al. . |
| 3,826,629 | 7/1974 | Pryor et al. . |
| 3,837,895 | 9/1974 | Pryor et al. . |
| 3,852,148 | 12/1974 | Pryor et al. . |
| 3,872,583 | 3/1975 | Beall et al. . |
| 3,875,478 | 4/1975 | Capstick . |
| 3,984,166 | 10/1976 | Hutchinson . |
| 4,054,938 | 10/1977 | Morris . |
| 4,057,825 | 11/1977 | Narita et al. . |
| 4,066,839 | 1/1978 | Cossutta et al. . |
| 4,105,861 | 8/1978 | Hascoe . |
| 4,109,054 | 8/1978 | Burgyan . |
| 4,135,038 | 1/1979 | Takami et al. . |
| 4,147,889 | 4/1979 | Andrews et al. . |
| 4,149,910 | 4/1979 | Popplewell . |
| 4,172,272 | 10/1979 | Schneider . |
| 4,258,411 | 3/1981 | Sherman . |
| 4,313,262 | 2/1982 | Barnes et al. . |
| 4,383,003 | 5/1983 | Lifshi et al. . |
| 4,385,202 | 5/1983 | Spinelli et al. . |
| 4,410,927 | 6/1982 | Butt . |
| 4,491,622 | 1/1985 | Butt . |

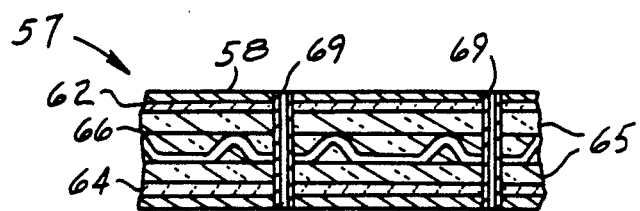
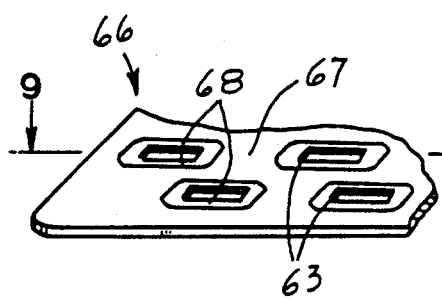
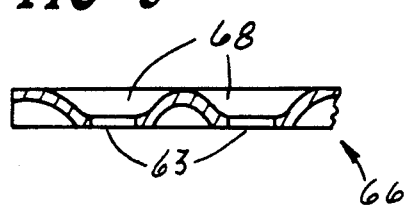
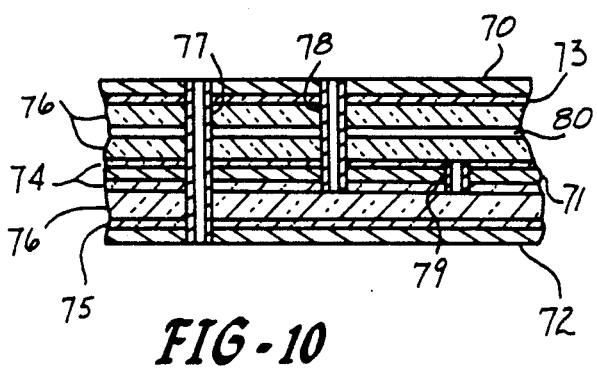
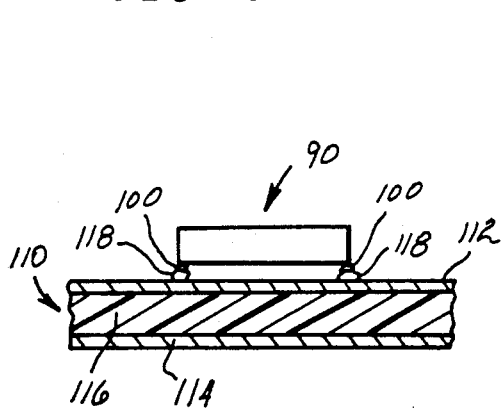
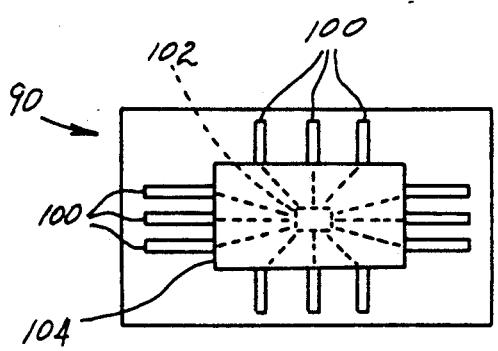

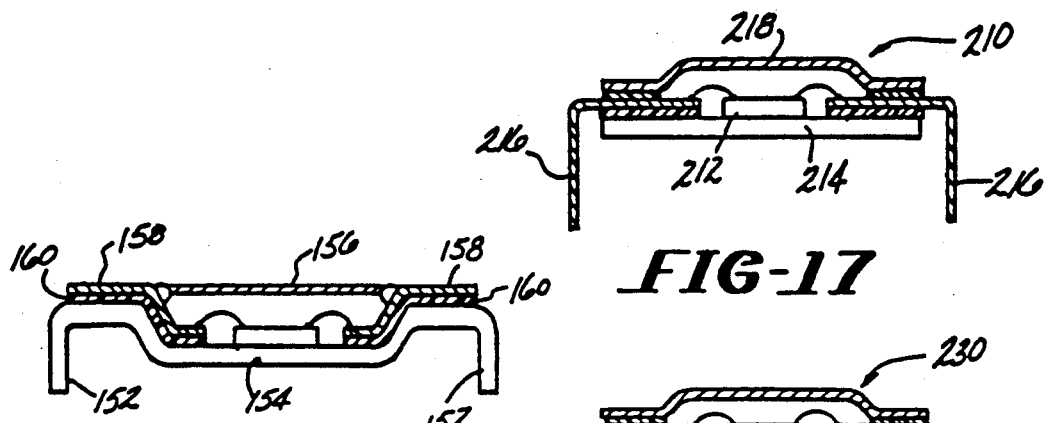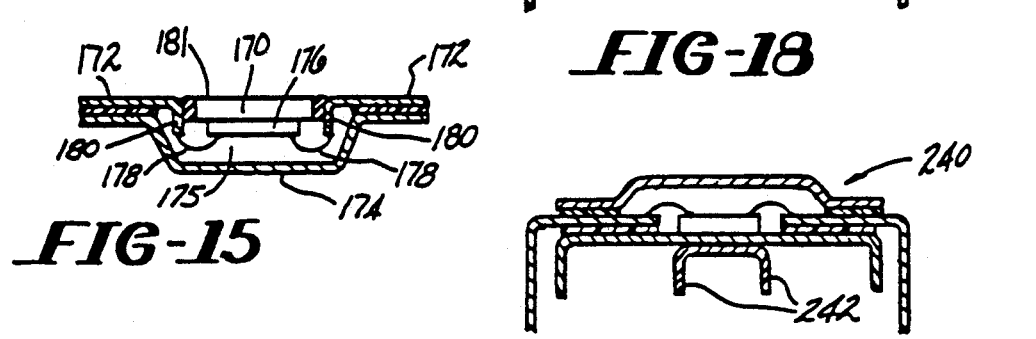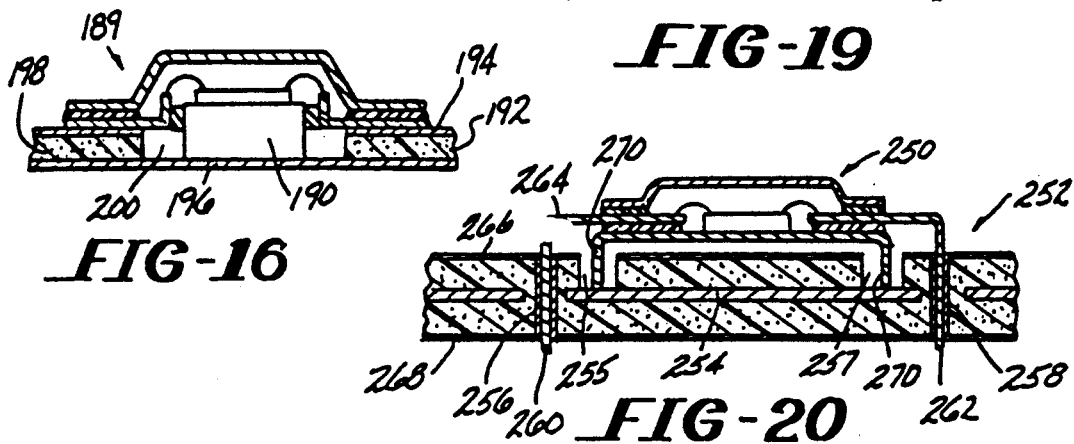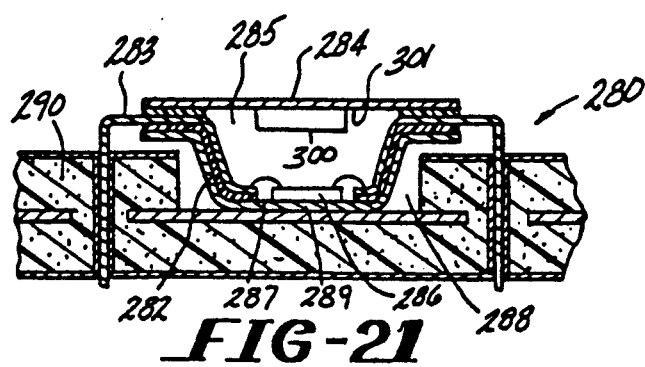

SEMICONDUCTOR PACKAGE

This application is a division, of application Ser. No. 643,530, filed Aug. 23, 1984 is a continuation of U.S. patent application Ser. No. 390,081, filed June 21, 1982 which is a continuation-in-part of copending application Ser. No. 369,785, IMPROVED CHIP CARRIER, by S. H. Butt, filed Apr. 19, 1982 now abandoned.

This application relates to U.S. Pat. No. 4,491,622, COMPOSITES OF GLASS-CERAMIC TO METAL SEALS AND METHOD OF MAKING SAME, by S. H. Butt, filed Apr. 19, 1982; U.S. Pat. Nos. 4,410,927 entitled "Semiconductor Casing" by S. H. Butt, filed June 21, 1982; 4,524,238 entitled "Semiconductor Packages" by S. H. Butt, filed Dec. 29, 1982; 4,532,222 entitled "Reinforced Glass Composites" by S. H. Butt, filed Mar. 21, 1983; 4,461,924 entitled "Semiconductor Casing" by S. H. Butt, filed Jan. 21, 1982; 4,480,262 entitled "An Improved Semiconductor Casing" by S. H. Butt, filed July 15, 1982; U.S. patent application Ser. Nos. 405,640 entitled "Improved Hermetically Sealed Semiconductor Casing" by S. H. Butt, filed Aug. 4, 1982, now abandoned; 413,046 entitled "Multi-Layer Circuitry" by S. H. Butt, filed Aug. 30, 1982; 517,592 entitled "Clad Metal Lead Frame Substrates" by S. H. Butt, filed July 27, 1983; U.S. Pat. Nos. 4,569,692 entitled "Low Thermal Expansivity and High Thermal Conductivity Substrate" by S. H. Butt, filed Oct. 6, 1983; 4,736,236 entitled "Tape Bonding Material and Structure for Electronic Circuit Fabrication" by S. H. Butt, filed July 25, 1986 which is a continuation of U.S. patent application Ser. No. 587,433 filed Mar. 8, 1984, now abandoned; 4,607,276 entitled "Tape Packages" by S. H. Butt, filed Mar. 8, 1984; and 4,577,056 entitled "Hermetically Sealed Metal Package" by S. H. Butt, filed Apr. 9, 1984.

While the invention is subject to a wide range of applications, it is especially suited for use in printed circuit board applications and will be particularly described in that connection.

The printed circuit industry produces most printed circuits by adhering one or more layers of copper foil to organic materials such as glass fiber reinforced epoxy, phenolic laminated paper, polyester films, polyimide films, etc. Although widely used, these structures have certain deficiencies. Firstly, their maximum operating temperature is restricted by the maximum temperature tolerance of the organic substrate used. Secondly, a substantial mismatch usually exists between the coefficient of thermal expansion of the organic substrate and that of the copper foil, that of the solder compositions normally used to attach components to the circuitry and that of the components themselves. The coefficient of thermal expansion of the organic materials is normally substantially greater than that of the copper foil, the solder or the components being attached to the circuit. This mismatch results in substantial "thermal stresses" whenever the finished product is thermally cycled. These stresses create a variety of failure modes, such as tensile failure of the copper foil, failure of the solder attachment of components to the circuit and tensile failure of the components themselves.

To alleviate some of the problems associated with thermal stress, the industry uses two distinct types of metal core boards. One is an epoxy or other organic insulation over the metal core (either steel or aluminum), and the other is porcelain enameled steel.

The most popular is the metal core-organic type. Typically, the metal core, such as 0.050" thick aluminum, is drilled with oversized holes. As the core is coated with epoxy, the holes are filled with the epoxy. Copper foil is then bonded to one or both surfaces of the core. The holes are redrilled to a desired size and a liner of the epoxy (or other organic) is left in each hole. The finished metal core board compares to and may be processed as a standard plastic board. This may include electroless deposition of copper in the holes to provide current paths from top to bottom, etc. Better heat dissipation is provided by the metal core board as compared to the glass fiber reinforced epoxy type boards with rather poor thermal conductivity.

The second type of board, porcelain enameled steel, is considered either a metal core board or a metal clad board depending on the terminology. First, porcelain enamel (essentially a glassy material) is applied to a sheet of steel. A circuit pattern is screen printed on the surface of the porcelain enamel with one of the thick film "conductive inks" and the board is refired to create a continuous pattern of metallic conductive elements. Through-holes cannot be used due to problems with short circuiting and, therefore, multi-layer boards are not manufactured in this manner. The porcelain (glass) is rather thick and its thermal conductivity is relatively poor; in fact, it is even poorer than the thermal conductivity of plastics used in plastic boards or as a coating in metal core boards described above. It follows that the heat dissipation characteristics of the porcelain board are poor.

Conductive ink technology usually requires multiple applications of the conductive ink to build a conductor pattern which is thick enough to carry a desired electric current. The multiple screening and firing operations used in applying the conductive ink tend to be relatively complicated and expensive.

Presently, there is an increase in the circuit density of printed circuit boards. This creates a need for narrower and more closely spaced "wires" or lines on the printed circuit board. The minimum line width generated by the state of the art conductive ink technology is limited by the printing process for applying the conductive ink. Also, the final conductive ink (generally either copper- or silver-) porcelain-steel product frequently has problems relating to the metallized pattern. The pattern may have a substantially different (higher) coefficient of thermal expansion than the steel substrate. This causes a substantial shear force at the circuit-porcelain interface and substantial risk of failure during thermal cycling.

Many of the above-mentioned considerations regarding clad metal are described in a paper entitled "Clad Metal Circuit Board Substrates for Direct Mounting of Ceramic Chip Carriers" by Dance and Wallace and presented at the First Annual Conference of the International Electronics Packaging Society, Cleveland, Ohio, 1981. Also, an article entitled "Use of Metal Core Substrates for Leadless Chip Carrier Interconnection" by Lassen in *Electronic Packaging and Production*, March 1981, pages 98–100, discusses the latest technology in metal core substrates.

Presently, copper foil is adhered to an organic printed circuit substrate by electrodeposition of "coral copper" to the foil surface. The result is a rough surface with re-entrance cavities to receive the surface layer of the organic substrate and/or the organic adhesive to form a "locked" mechanical bond. Since the surface layer is a conductive metal structure (copper) embedded in the organic material, considerable care must be exercised to remove any residual coral copper treatment from the spaces between the final printed circuit lines. This avoids unwanted current passing between lines, bridging of solder across the spaces between lines, etc. In principal, removal of residual coral copper treatment from areas requires additional etching beyond that required to remove the base foil itself. This excessive etching leads to additional undercutting and partial destruction of the circuit pattern. Thus, the manufacturer of conventional copper foil-organic circuit boards must strike a balance between enough etching to reliably remove the coral copper treatment while minimizing excessive etching to prevent undercutting of the circuit pattern.

The increased complexity of circuitry for interconnecting various devices mounted upon a printed circuit board often requires that both surfaces of the board contain conductive patterns. Some of the interconnections are provided by the circuit pattern on the obverse face of the board (the surface to which the components are mounted), while other interconnections are provided upon the reverse side of the board. The interconnection between the obverse and reverse sides of the board may be provided by solder filled through-holes. Conventional two sided copper foil-organic boards of this general configuration are widely used. However, in state of the art porcelain enameled steel substrate boards, two sided boards are not practical since the solid and continuous steel substrate creates a continuous path for electrical conduction from one through hole to another.

In certain applications, the circuit requirements include a double sided or multi-layered board in which thermal exposure or other factors prevent the use of a copper foil-organic board. An alternative is a metal circuit pattern on both sides of a suitable ceramic, nonconductive substrate with interconnection between the two circuits by conductive through-holes. This technique is used on specialized printed circuit boards and upon substrates for hybrid packages.

As integrated circuits become larger (more individual functions on a single silicon chip), and there is a corresponding increase in the number of leads for interconnection, the principal means of integrated circuit interconnection, the dual-in-line (DIP) package becomes impractical. A DIP includes a lead frame with the leads emerging from the package and formed into "pins". As its name indicates, the DIP package has two rows of pins, one on either side of the package. The pins are inserted and soldered into holes in a printed circuit board. Characteristically, the pins are spaced apart on 0.100" centers. A relatively simple device requiring a 20 lead package, 10 on a side, will be approximately 1" long. A 40 lead DIP package is about 2" long and a 64 lead DIP package, about the largest now made, is approximately 3.2" long. For reasons relating to geometry, as the packages become longer with more pins, they become wider. Typically, the width of the completed package is approximately one-third its length. For both mechanical and electronic reasons, DIP packages with more than 64 leads are considered impractical to manufacture. However, large-scale integrated circuits often require more interconnections than provided by DIP packages. Even with smaller integrated circuits, the circuits are spaced together on the printed circuit board as closely as possible. Obviously, the package size limits the closeness of the spacing. Therefore, the semiconductor industry has a growing interest in "chip carriers".

Chip carriers deal with the problems of large-scale circuits requiring more interconnections than provided by a DIP package as well as reduction of package size for intermediate sized integrated circuits to increase component density on the printed circuit board. The term chip carrier, in its broadest sense, relates to packages, both ceramic and plastic. The configuration of a chip carrier may be essentially square and leads emerge from within the package on all four sides. Furthermore, typical center-to-center spacing of leads on a chip carrier is 0.050". Thus, a 64 lead device having a "footprint" of roughly 3.25"×1.1" in a DIP package has a "footprint" of approximately 0.8"×0.8" in a chip carrier package. More importantly, the area covered by the chip carrier would be approximately 18% of that covered by the DIP package. At this time, chip carrier packages with 128 and more leads are being produced.

The principal constraint in establishing 0.100" as the normal spacing between leads on the DIP package is the insertion of the lead pins into holes on the printed circuit board. Allowing for the hole, a pad area around the hole for solder adhesion and spacing between the holes to electrically isolate them from each other, it becomes difficult to crowd them much closer together.

Typically, the coefficient of thermal expansion of the DIP package is different from that of the printed circuit board. The extent to which board and package dimensions change with varying temperature can be accommodated by deflection of the leads, i.e. between the printed circuit board and the package. Effectively, the leads become spring members which accommodate the differences in coefficient of expansion.

State of the art chip carriers having 0.050" leads are not normally mounted by insertion of the leads into holes in the printed circuit boards. Instead, most chip carriers use a surface mounting technique in which the lead forms a pad mounted flush to the printed circuit board and is soldered in place. The metallized pads on the exterior surface of the chip package are integral with the package and expand and contract with the package. There is no accommodation for deflection of leads due to changes in board and package dimensions, as in the case of DIP packages, during thermal cycling. As a result, the solder bond between the pad and the board is subjected to substantial stresses. The stresses increase as the total package size becomes larger and/or the board's operation is in an expanded temperature range. Repeated stressing of the solder bond leads to fatigue failure.

As with DIP packages, chip carrier packages may use a plastic package or may require a hermetic package. With the DIP package, essentially the same external configuration is employed for a hermetic (Ceramic Dual-In-Line Package) or a plastic package. In both configurations, the flexible leads accommodate for differential thermal expansion.

The "standard" glass cloth reinforced epoxy board material has a coefficient of thermal expansion of $15.8 \times 10^{-6}/°C$. Ceramic chip carriers usually made from an aluminum oxide ceramic have a coefficient of thermal expansion of $6.4 \times 10^{-6}/°C$. If thermal conductivity is particularly important, they made be made from beryllium oxide also having a coefficient of thermal expansion of $6.4 \times 10^{-6}/°C$. In either event, there is a substantial mismatch in coefficient of thermal expansion between the board and the chip carrier. Therefore, substantial stresses are imposed on the solder bond when subjected to significant thermal cycling.

One solution has been to surface mount the chip carrier to a metallized pattern on an aluminum oxide ceramic substrate. The substrate has the same coefficient of thermal expansion as the chip carrier. Pins may be brazed to the alumina substrate and plugged into holes in the printed circuit board. Although this sort of configuration avoids problems associated with mismatch in coefficient of thermal expansion, it also has the effect of sacrificing much of the space saving advantage of the chip carrier.

A description of the latest technology with respect to chip carriers is presented in an article entitled "Chip-Carriers, Pin-Grid Arrays Change the PC-Board Landscape" by Jerry Lyman, *Electronics*, Dec. 29, 1981, pages 65-75. Another article entitled "Chip Carriers: Coming Force in Packaging" by Erickson, in *Electronic Packaging and Production*, March 1981, pages 64-80 discusses the construction and other details concerning chip carriers.

U.S. Pat. No. 3,546,363 to Pryor et al. discloses a composite metal product for use as a seal to glasses and ceramics which has properties of a low coefficient of expansion, approximating that of the appropriate glasses and ceramics, good thermal conductivity, and fine grain size in the annealed condition.

U.S. Pat. Nos. 3,546,363; 3,618,203; 3,676,292; 3,726,987; 3,826,627; 3,826,629; 3,837,895; 3,852,148; and 4,149,910 disclose glass or ceramic to metal composites or seals wherein the glass or ceramic is bonded to a base alloy having a thin film of refractory oxide on its surface.

U.S. Pat. application Ser. No. 261,330, filed May 7, 1981 (now abandoned) to Butt et al discloses for example, "a process for thermosonically bonding leadwires to leadframes having a thin refractory oxide layer".

U.S. Pat. No. 341,392, filed Jan. 19, 1982 to Butt discloses for example, "a highly reliable metal casing which is sealed and bonded using an adhesive".

It is a problem underlying the present invention to provide a semiconductor package by itself or mounted on a circuit board which can accommodate substantial thermal cycling.

It is an advantage of the present invention to provide a semiconductor package by itself or mounted on a circuit board which obviates one or more of the limitations and disadvantages of the described prior arrangements.

It is a further advantage of the present invention to provide a semiconductor package by itself or mounted on a circuit board which substantially reduces the formation of stresses between the chip carrier and the circuit board due to thermal cycling.

It is a still further advantage of the present invention to provide a semiconductor package by itself or mounted on a circuit board which is relatively inexpensive to manufacture.

It is a further advantage of the present invention to provide a semiconductor package by itself or mounted on a circuit board having improved heat dissipation.

Accordingly, there has been provided a semiconductor package for mounting a chip. The package includes a first metal or metal alloy component having a first thin refractory oxide layer on a first surface. The chip is bonded to the first component. A skirt extends from the first component for strengthening the first component and providing heat transfer from the semiconductor package. A second metal or metal alloy lead frame having second and third refractory oxide layers on opposite surfaces is electrically connected to the chip and is bonded to the first oxide layer. Also, the lead frame is insulated from the first component by the first and second refractory oxide layers. A second metal or metal alloy component has a fourth refractory oxide layer on one surface and is bonded to the third refractory oxide layer so that the chip is hermetically sealed between the first and second components. Other embodiments of the present invention include both leadless and leaded hermetic semiconductor packages and innovative relationships between the packages and printed circuit boards.

The invention and further developments of the invention are now elucidated by means of preferred embodiments shown in the drawings;

FIG. 7 is a cross-sectional view of a printed circuit board having circuits on opposite surfaces and a metal grid therebetween;

FIG. 8 is a top view of a metal grid used for reinforcement of a printed circuit board;

FIG. 9 is a view through 9—9 of FIG. 8;

FIG. 10 is a side view of a multi-layer printed circuit board in accordance with the present invention;

FIG. 11 is a side view of a leadless chip carrier in accordance with the present invention;

FIG. 12 is a view through 11—11 of FIG. 10;

FIG. 13 is a side view of a leadless chip carrier mounted upon a printed circuit board in accordance with the present invention.

FIG. 14 is a cross-sectional view of a hermetic package with a skirted substrate;

FIG. 15 is a cross-sectional view of a hermetic package with a skirted substrate;

FIG. 16 is a cross-sectional view of a hermetic package with a skirted substrate with cooling fins;

FIG. 17 is a cross-sectional view of a hermetic package with leads;

FIG. 18 is a cross-sectional view of a hermetic package with a drop center substrate contacting a heat sink in a printed circuit board;

FIG. 19 is a cross-sectional view of a leadless chip carrier having a skirted substrate;

FIG. 20 is a cross-sectional view of an inverted leadless chip carrier having a substrate bonded to the lead frame; and FIG. 21 is a cross-sectional view of a chip carrier having a thick substrate in contact with a heat sink in a printed circuit board.

Figure 1:
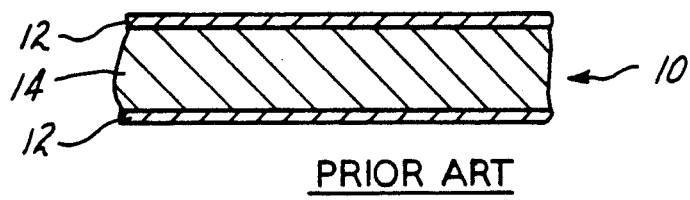
FIG. 1 is a cross section of a prior art printed circuit board.

As shown in FIG. 1, prior art printed circuits 10 are produced by adhering one or more layers of copper foil 12 to organic material 14 such as glass fiber reinforced epoxy, phenolic laminated paper, etc. These structures have several deficiencies including restricted maximum operating temperature due to the organic substrate and substantial mismatch between the coefficient of thermal expansion of the organic substrate and that of the copper foil, the solder compositions to attach components to the circuitry and the components themselves. Substantial thermal stresses, resulting from the mismatch, create failure modes such as tensile failure of the copper foil, failure of the solder attachment of components to the circuit and tensile failure of the components themselves.

Figure 2:
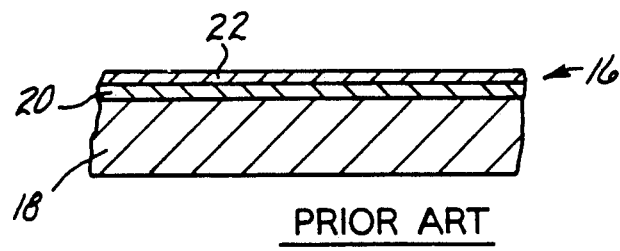
FIG. 2 is a cross section of a metal core prior art printed circuit board.

There is some use of metal core boards 16 found in FIG. 2. Typically, these include a metal core 18, a copper foil and an epoxy insulating layer 20 bonded to both layer 20 and foil 22. This type of board provides better heat dissipation than the normal glass fiber reinforced epoxy boards but still has the restricted maximum operating temperature related to the organic substrate. Also, substantial mismatch between the coefficient of thermal expansion of the organic substrate and the copper foil causes the types of problems associated with conventional printed circuits as shown in FIG. 1.

Figure 3:
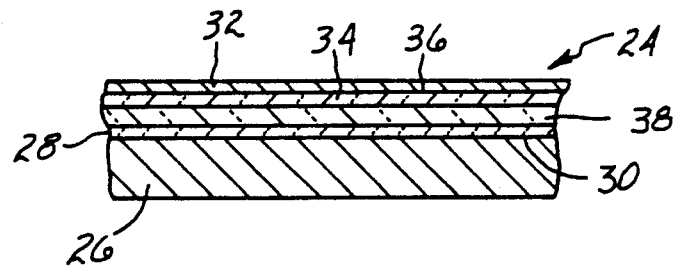
FIG. 3 is a cross section of a printed circuit board having a glass component bonded between the refractory oxide coating of two copper alloys in accordance with the present invention.

The present invention overcomes these problems by providing a composite or printed circuit board 24 as shown in FIG. 3. The composite may include a first metal or metal base alloy component 26 having a thin refractory oxide layer 28 on at least a first surface 30 thereof and a second thin refractory oxide layer 34 on at least surface 36 of a metal or metal base alloy component 32. A glass component 38 is bonded to the first and second thin refractory oxide layers 38 and 34 to insulate the component 26 from the second component 32.

The preferred alloy for use in the embodiments of the present invention is a copper base alloy containing from 2 to 12% aluminum and the balance copper. Preferably, the alloy contains from 2 to 10% aluminum, 0.001 to 3% silicon, and if desired, a grain refining element selected from the group consisting of iron up to 4.5%, chromium up to 1%, zirconium up to 0.5%, cobalt up to 1% and mixtures of these grain refining elements and the balance copper. In particular, CDA alloy C6381 containing 2.5 to 3.1% aluminum, 1.5 to 2.1% silicon, and the balance copper is useful as a substrate for this invention. Impurities may be present which do not prevent bonding in a desired environment.

The alloys useful with this invention and, especially alloy C6381 as described in U.S. Pat. Nos. 3,341,369 and 3,475,227 to Caule et al. which disclose copper base alloys and processes for preparing them, have a refractory oxide layer formed to one or more of its surfaces. The oxide layer may include complex oxides formed with elements such as alumina, silica, tin, iron chromia, zinc, and manganese. Most preferably, the refractory oxide layer is substantially aluminum oxide ($Al_2O_3$). The formation of the refractory oxide to the substrate may be accomplished in any desired manner. For example, a copper base alloy such as alloy C6381 may be preoxidized in gases having an extremely low oxygen content. The C6381 may be placed in a container with 4% hydrogen, 96% nitrogen and a trace of oxygen released from a trace of water mixed in the gas. This gas may be heated to a temperature of between about 330° C. and about 820° C. Depending on the temperature and amount of time the alloy is left in the heated gas, a refractory oxide layer of a desired thickness forms on the surface of the alloy.

The present invention is not restricted to applications of alloy C6381 but includes the broad field of metal or alloys which have the ability to form continuous refractory oxide layers on their surface. Several examples of other metal alloys such as nickel base and iron base alloys are disclosed in U.S. Pat. Nos. 3,698,964, 3,730,779 and 3,810,754. Alloy C6381 is particularly suitable for this invention because it is a commercial alloy which forms such films when heated. The copper or copper base alloy component may also include composite metals in which the refractory oxide forming metal or alloy is clad upon another metal by any conventional technique. This other metal may be another copper alloy or any other metal whose bulk properties are desired for a specific application.

The present invention uses any suitable solder glass or ceramic component 38 preferably having a coefficient of thermal expansion/contraction which closely matches the metal components. The glass is bonded to the thin refractory oxide layers 28 and 34 and functions to adhere the metal components together and electrically insulate them from each other. When the glass and the copper alloy substrates preferably have the same or closely matched coefficients of thermal expansion, thermal stresses in the system may be essentially eliminated and the problems associated with thermal stress in the finished product alleviated. However, the specific character of the refractory oxide layer present on the preferred alloys C638 or C6381 allows bonding to solder glasses with significantly lower expansion/contraction coefficients than that of the alloy. It has been demonstrated that mechanically sound bonds can be achieved between C638 (coefficient of thermal expansion of $171 \times 10^{-7}$ in/in/°C.) and CV432 (contraction coefficient of $127 \times 10^{-7}$ °C.).

Table I lists various exemplary solder glasses which are adapted for use in accordance with this invention.

TABLE I

| Solder Glass or Ceramic Type | Coefficient of Thermal Expansion, in./in./°C. |
| --- | --- |
| Ferro Corp.[1] No. RN-3066-H | $167 \times 10^{-7}$ |
| Ferro Corp.[1] No. RN-3066-S | $160 \times 10^{-7}$ |
| Owens Illinois[2] No. EJ3 | $160 \times 10^{-7}$ |
| Owens Illinois[2] No. CV432 | $127 \times 10^{-7}$ |

[1]Proprietary composition manufactured by Ferro Corporation, Cleveland, Ohio.
[2]Proprietary composition manufactured by Owens Illinois Corporation, Toledo, Ohio.

Figure 4:
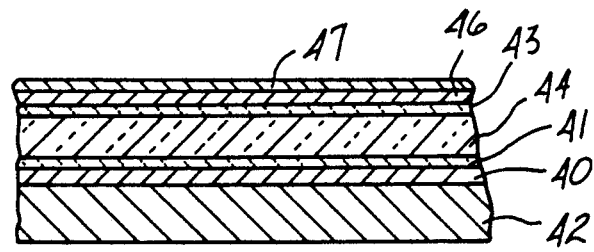
FIG. 4 is a printed circuit board having high thermal conductivity substrates bonded to copper alloy components.

Referring again to the embodiment as illustrated in FIG. 3, a foil layer 32 is bonded to a thicker supportive layer 26 by means of glass 38. The foil 32 may be subsequentially treated with a "resist" pattern and etched to produce a printed circuit. The result is a wrought copper alloy circuit pattern bonded to and insulated from a wrought copper alloy supportive substrate 26 by a layer of glass 38 which serves as both an adhesive and an insulating material. This configuration has a number of advantages over the prior technique of printing circuitry upon the surface of porcelain with conductive ink. Firstly, in the prior conductive ink technology, multiple layers of the conductive ink are applied to provide an adequate conductive pattern for the required electric current. However, the circuit foil 32 may be of any desired thickness and replaces the multiple screening and firing operations by a single firing operation and a single etching operation. Secondly, recent increases in circuit density of printed circuit boards create a need for narrower and more closely spaced printed "wires"

or lines. The prior conductive ink technology is limited to the minimum line width generated by the printing process. The present invention, however, etches copper foil and provides narrow lines and spaces as in conventional etched copper foil, organic substrate circuits. Thirdly, the metallized pattern formed on the conductive ink-porcelain-steel circuit board has a substantially higher coefficient of thermal expansion than the steel substrate. Thermal cycling develops substantial shear forces at the circuit-porcelain interface creating substantial risk of failure. The embodiment of FIG. 3 substantially eliminates these shear forces because the coefficient of thermal expansion of the circuit foil and the metal substrate may be substantially the same.

Where greater conductivity than that inherent in the metal or alloys producing bondable alumina and silica films is desired, a composite copper alloy foil incorporating a higher conductivity layer, as shown in FIG. 4, may replace the solid alloy 32 as in the previous embodiment.

The embodiment of FIG. 4 includes bondable copper alloy substrate 40 and circuit foil 46 having refractory oxide layers 41 and 43, respectively. A glass or ceramic 44 is bonded between the oxide layer 43 on circuit foil 46 and the oxide layer 41 on the copper base alloy 40. Substrate 40 is bonded, as a composite, to a copper or high conductivity copper alloy thicker component 42. The latter provides for superior thermal dissipation from the board as compared to both conventional copper foil-organic boards and porcelain on steel boards. Also, foil 46 may be bonded as a composite to a copper or high conductivity copper alloy component 47 for superior electrical or thermal conductivity. It is also within the scope of the present invention to provide only one of the components 42 or 47 as required. It is also within the scope of the present invention to modify any of the described embodiments by bonding the component, as a composite, to a metal layer having desired physical properties.

Figure 5:
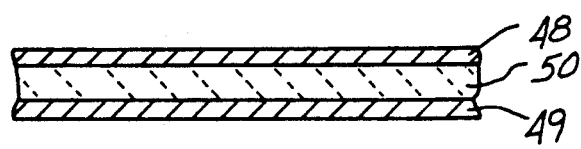
FIG. 5 is a cross-sectional view of a printed circuit board with a fused refractory oxide layer between two substrates.

The embodiment as shown in FIG. 5 provides copper alloy substrates 48 and 49 each forming a refractory oxide layer. These refractory layers are fused together into layer 50 and dispense with the provision of glass. The unified refractory oxide layer 50 both adheres the metal substrates 48 and 49 and insulates them from each other. It is within the scope of the invention to substitute the glass in the embodiments of the present invention with fused refractory layers as desired.

The complexity of the circuitry for interconnecting the various devices mounted upon a printed circuit board often requires that both surfaces of the board contain conductive patterns. Details of prior art two sided circuit boards are described in the background of the invention.

Figure 6:
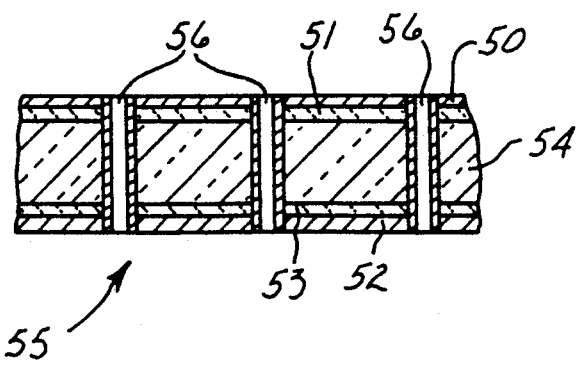
FIG. 6 is a printed circuit board having circuits on opposite surfaces and interconnections therebetween.

A two sided circuit board configuration 55, as shown in FIG. 6, has two relatively thick layers of copper base alloy components 50 and 52, each having a thin refractory oxide layer 51 and 53, respectively, on at least one surface. The components are bonded together and insulated from one another by a glass or ceramic 54 which is fused to the oxide layers 51 and 53. A circuit pattern is formed on each of the components 50 and 52 by a conventional technique. The thickness of each metal component is established in accordance with the desired stiffness of the finished board. The circuit patterns on each side of the board 55 must be carefully designed to provide reasonable stiffness and to avoid planes of weakness. Such planes might develop if an area of considerable size without any circuitry on one side of the board coincides with a similar area on the reverse side of the bond. Through-holes 56 may be provided in the circuit board by any conventional technique such as drilling or punching. The through-holes may be formed into a conductive path by any suitable means such as electroless deposition of copper on their walls. If desired, the through-holes can then be filled with a conductive material such as solder.

Another embodiment of a two sided metal glass printed circuit board 57, as shown in FIG. 7, includes two copper alloy substrates 58 and 60, each having a thin refractory oxide layer 62 and 64, respectively, bonded on at least one surface. A glass component 65 is fused to the layers 62 and 64. A grid 66, preferably metal, is bonded in the glass 65 and insulated from the alloy substrates 58 and 60. The recesses 68 of the grid may be filled with glass 65 or any other suitable inorganic filler. Through-holes 69 are formed in the board as described above. The result is a board with the same design flexibility as conventional foil-organic boards but with the advantage of substantial elimination of thermal stresses. The metal grid both stiffens the board 57 and permits a plurality of through-holes 69 to pass through openings 68 of the grid. The through-holes must not contact the metal grid to avoid short circuits.

The metal grid is preferably made of a copper alloy having a thin refractory oxide layer on both surfaces. It is, however, within the scope of the present invention to use any desired material to construct the grid. The grid may be formed with any desired configuration, and a typical one is shown in FIG. 8. A series of recesses 68 are stamped in a metal sheet 67. Subsequently, the bottom 71 of the recesses are pierced leaving a pattern of interlocking "V" bars, as shown in FIG. 8, for reinforcement.

The need for still greater circuit complexity than provided by a two sided circuit board leads to multi-layer circuit boards with three or more layers of copper foil. Using the concepts described hereinabove, a multi-layer board composed of alternate layers of copper alloy foil having a thin refractory oxide layer on each surface in contact with the glass insulator is described. As shown in FIG. 10, copper foil components 70, 71 and 72 have their refractory oxide layers 73, 74 and 75, respectively, bonded to glass 76. The foil components may each be provided with circuitry as in the embodiments described above. Also, the components may be bonded as composites to other metals with desired physical properties as described above. It is thought that the thicker multi-layer boards will be sufficiently rigid. Where additional rigidity is required, grid reinforcement as described and illustrated in FIG. 7 may be added. Also, through-holes 77, 78 and 79 between the circuits, as described above, may be provided as necessary. Note that the through-holes may be between any number of circuits.

Since the power consumption of most board mounted electronic components is quite modest, the heat generated during their operation is comparably small. However, as packaging density becomes greater, more elaborate means for cooling must be provided. The present invention provides for cooling of the multi-layer printed circuit boards, as shown in FIG. 10, by bonding high thermal conductivity layers of copper alloy to the circuit foil, as in FIG. 4. This layer of copper alloy functions to conduct heat from the board. It is within the scope of the invention to provide one or more layers of conductive material 80 within the multi-layer board. Material 80 may be a solid strip of high thermal conductivity material such as copper or copper alloy. It may be desirable to use a copper alloy having a refractory oxide layer for improved bonding to the glass 76. Naturally, any through-holes may require insulation from the strip 80. The conductive material 80 may comprise one or more tubular members embedded in the glass to provide coolant passages. Again, it is preferable that the copper tubing have a thin refractory oxide layer on its surface to bond to the glass.

Another important aspect of the present invention resides in the provision of a leadless ceramic chip carrier which can be directly mounted to the surface of a printed circuit board. This chip carrier substantially eliminates excessive stressing of the solder bond to the circuit board which generally occurs during thermal cycling of the chip carrier-printed circuit board systems as described hereinabove. Referring to FIGS. 11 and 12, there is illustrated a leadless chip carrier 90 wherein a copper alloy 92 with a thin refractory oxide layer 93, such as $Al_2O_3$, provided on one surface thereof is substituted for the prior art alumina or beryllia ceramic. A glass 94 may be fused onto the oxide layer as described above. It is, however, within the scope of the invention to use only the oxide layer. As can be seen in FIG. 11, the copper alloy 92 may be shaped with a slight indentation 96, exaggerated in the drawing to better clarify the concept. It is within the scope of the present invention to form the indentation in any desired configuration. A metal foil 98, which may be formed of the same material as 92, having a refractory oxide layer 99, is bonded to the glass 94 or oxide layer 93 and etched in any conventional manner to provide electrical leads 100. A chip 102 is preferably attached to the glass 94 by any conventional technique and lead wires connected between the circuitry on the chip and the leads 100.

The chip may be sealed within the indentation 96 by several techniques. Preferably, the sealing device 97 may be a cover plate 104 comprising a copper or copper base alloy having a thin refractory oxide layer thereon. Glass 95 is fused onto at least the edges of the cover 97. This glass can be bonded to either the refractory layer 99 on the component 98 or to the glass 94 as required. The result is to hermetically seal the chip 102 in the leadless chip carrier 90. Another embodiment provides the seal by filling the indentation 96 with an epoxy. The epoxy will bond to the leads and the glass and provide an adequate but not necessarily hermetic seal.

Referring to FIG. 13, the leadless chip carrier 90 is affixed to a typical printed circuit board 110. This board has copper foil 112 and 114 separated by glass cloth reinforced epoxy 116. A circuit is provided on the foil 112. The leadless chip carrier may be applied directly onto the circuitry of strip 112 by solder pads 118 between the lead 100 and the foil 112 in a conventional manner.

Alloy C6381, the preferred material of alloy components 92 and 98 of the chip carrier, has a coefficient of thermal expansion of $17.1 \times 10^{-6}/°C$. This is only 8.2% different from the coefficient of thermal expansion of conventional glass cloth reinforced epoxy which is $15.8 \times 10^{-6}/°C$. This is a vast improvement over chip carriers formed of alumina ceramic which have a coefficient of thermal expansion of $6.4 \times 10^{-6}/°C$., i.e. approximately 144% greater than the thermal expansion of the alumina ceramic. The result is a significant decrease in the formation of stress between the solder, leads and circuit board due to thermal cycling.

As the number of individual functions incorporated upon a single silicon chip becomes larger, the amount of heat generated requiring dissipation increases accordingly. Also, as the number of functions become greater, they are packed more closely together on the chip which further magnifies the problem of heat dissipation. It is a further advantage of the present invention that the thermal conductivity of alloy C6381 is 24 $Btu/ft^2/ft/hr/°F$. This is 131% greater than the thermal conductivity of alumina oxide (typically used for chip carriers) which is 10.4 $Btu/ft^2/ft/hr/°F$. Also, the thermal resistance imposed between the chip and the exterior means of heat dissipation is reduced because of the thinner sections of the tougher material such as 6381 which are able to replace the thicker, more fragile and brittle materials such as alumina ceramics. It should be noted that in certain applications, beryllia with a thermal conductivity of 100 $Btu/ft^2/ft/hr/°F$. is used as a substrate for better heat dissipation despite its extremely high cost.

Referring again to FIG. 11, the copper alloy component 92 with a refractory oxide layer may be clad upon copper or any high conductivity alloy 112. Assuming that the composite metal is approximately 10% alloy C6381 clad upon 90% alloy C151, the overall thermal conductivity is 196 $Btu/ft^2/ft/hr/°F$. This is 18.8% better than the thermal conductivity of alumina and 63% better than that provided by beryllia. In addition, there is the additional advantage of a thinner chipless carrier as compared to a thicker alumina carrier.

The surface mounted hermetic chip carrier as described above and illustrated in FIG. 12 will resolve most of the normal problems associated with the effect of thermal cycling on a chip carrier that is surface mounted to a conventional glass cloth reinforced epoxy printed circuit board. However in some cases, a closer match of coefficient of thermal expansion may be required and/or greater heat dissipation capability may be necessary. In these cases, a metal board configuration of the types described hereinabove and illustrated in FIGS. 2–7 and 10 may be substituted for the conventional printed circuit board.

In one embodiment, reduced mismatch of thermal expansion and greater heat dissipation can be achieved by mounting a chip carrier of the type illustrated in FIGS. 11 and 12 on a prior art printed circuit board as shown in FIG. 2 where the core is copper or a high conductivity copper alloy. An alloy may be desirable if greater strength is required than may be provided with pure copper. A suitable plastic insulating layer 20 is appropriately bonded to the copper or copper alloy core and in turn, the printed circuit foil 22 is bonded to the insulating layer. The plastic must be suitable for bonding with adhesives, have suitable dielectric characteristics and the ability to withstand processing temperatures such as soldering. The thermally conductive plastics may be particularly useful for the plastic layer. These plastics typically contain metal powders to improve their thermal conductivity while maintaining dielectric properties since the metal powders are not in a continuous phase. Since the plastic is only thick enough to provide the necessary dielectric properties, resistance to heat transfer from the chip carrier to the high conductivity copper or copper alloy core is minimized. It can be appreciated that the coefficient of thermal expansion of the metal board is essentially the same as that of the glass coated chip carrier and, therefore, stresses induced by thermal cycling of the system are substantially eliminated. This configuration is limited by the temperature capability of the plastic or plastics and the temperature resistance of the adhesives which are used in conjunction with the plastics.

To improve the maximum temperature capability of the leadless chip carrier and printed circuit board combination, a printed circuit board as illustrated in FIG. 3 may be used in conjunction with the leadless chip carrier 90 shown in FIG. 11. In this configuration, the metal core consists of copper or a high conductivity copper alloy 26 to which is clad alloy C6381 or an alternative glass bondable copper alloy. In turn, a printed circuit foil 32 consisting of a glass bondable copper alloy such as C6381 is bonded to the glass 38. The alloy bonded to the C6381 may be selected from copper or high conductivity copper alloys so as to improve the electrical conductivity in the circuit or to provide optimum solderability characteristics. The system is completely inorganic and will withstand temperatures much higher than systems with organic materials and further avoids various modes of degradation to which organic materials are susceptible.

An additive circuit may be substituted for photo-etched foil 48 in FIG. 5. The circuit may be generated upon a glass coating applied to the refractory oxide layer on alloy C6381 or other glass bondable alloy core material 49 using conventional techniques employed in generating additive circuits. For example, the additive circuit may be a pattern printed upon the surface of the glass with conductive ink and fired into place. It is also within the scope of the present invention for the alumina film which may be formed by heating the alloy to be used as the dielectric layer separating the metal core from the additive circuit.

Whereas an oxide layer has been described as being formed by separately heating the metal or alloy, it may be formed in any manner such as during the process of bonding the metal or alloy to the glass, ceramic or another oxide layer.

Whereas the chip carrier has been described as leadless, it is also within the scope of the present invention to substitute a chip carrier with leads.

Referring to FIG. 14, there is illustrated an embodiment of the present invention which is similar to the embodiment of FIG. 11. A substrate member 154 has an indentation there into support the chip. A lead frame 158 is disposed on an inner surface of the substrate member and extends from the edges of the substrate member to within the indentation which forms a hollow enclosure to receive the chip. A cover member 156 is disposed so that its outer edge is in contact with the lead frame to enclose the chip within the hollow enclosure between the indentation and the cover. An added peripheral skirt 152 preferably extends outwardly from opposite sides of the substrate member 154 at any desired angle. The skirt extends outwardly from at least two opposite edges of the substrate member and transversely out of the plane of the substrate member and beyond the substrate member. Although the skirt is preferably provided only along two sides of the substrate, it is also within the scope of the present invention to extend the skirt outwardly from at least opposite edges or all four edges of the substrate member and transversely out of the plane of the substrate member. Skirt 152 imparts additional strength and stiffness to the substrate 154. The stiffening effect of the skirt may permit a substantial reduction in the thickness of the substrate and thereby provide a source of cost reduction. The skirt also enhances the thermal dissipation of the substrate by providing additional heat transfer surface to augment conductive heat transfer to the atmosphere. A lead frame 158 is disposed on said substrate member an extends substantially from the edges of said substrate member to within said indentation. A cover 156 is disposed with its edges in contact with the lead frame to enclose the chip within the indentation. The cover lid 156, lead frame 158 and the substrate 154 are formed of metal or metal alloys having a refractory oxide layer on their surface as disclosed above. Accordingly, although not illustrated, the refractory oxide layers are provided between the sealing glass 160 and the metal components.

The embodiment as illustrated in FIG. 15 is an inverted package in which the substrate 170 becomes a plug which is glass bonded to a lead frame 172. The substrate 170 has first and second oppositely disposed surfaces and the chip mounted on a first surface. The substrate member has at least two opposite outer surfaces extending between the first and second oppositely disposed surfaces. The leadframe 172 is disposed adjacent said outer edge surfaces and has one free end extending outwardly in the plane of the outer edge surfaces and has one free end extending outwardly in the plane of the outer edge surfaces and the other free end extending transversely out of the plane of the edge surfaces. The one free end of the lead frame is adapted to be electrically interconnected to the chip. A cover 174, having an indentation to form a cavity 175, is glass bonded to the lead frame 172 as described in the various embodiments set out above. The cover is disposed against a portion of the other free end of the lead frame extending transversely out of the plane of the opposite edge surfaces. During the assembly of this package, the chip 176 is mounted upon the plug 170, the plug is joined to the lead frame, and the interconnection of the wires 178 between the chip and the tips 180 of the lead frame is preferably completed before the cover is glass bonded to the lead frame. This hermetically sealed inverted package permits the outer surface 181 of substrate 170 to contact the metal foil on the surface of a printed circuit board and thus dissipate heat generated by the chip through the printed circuit board. The metal or metal alloys used in this embodiment have refractory oxide layers on surfaces for bonding to other components.

Another embodiment of the present invention is illustrated in FIG. 16. The illustrated semiconductor package 189 is substantially the same as the embodiment shown in FIG. 15 except that the substrate 190 is relatively thick. This embodiment is most advantageously used with a conventional printed circuit board 192 including a copper foil 194, a heat sink 196 and an organic filler 198. A section 200 is removed from the circuit board to permit the plug 190 to be affixed to the heat sink 196. The plug may be attached to the heat sink by any conventional manner such as, for example, soldering. The contact between the plug and the heat sink or ground plate 196 in the printed circuit board provides for improved heat dissipation from the semiconductor package 189.

FIG. 17 illustrates a hermetically sealed casing 210 having a lead frame extending from the casing for packaging an electrical component 212. The casing includes a substrate 214, a lead frame 216 and a cover 218. The materials used to construct the substrate lead frame or cover are preferably alloys with refractory oxide surfaces of the type described hereinabove. Also, the materials may be composites of alloys having a refractory oxide surface and other metals or alloys with desired physical qualities. The components are bonded together using a glass in the manner described in the embodiment of FIG. 11.

The embodiment of FIG. 18 is a hermetically sealed package 230 which is similar to the package 210 of FIG. 17. Package 230 has an additional peripheral skirt 232 which extends from opposing sides of substrate 234. Although the skirt is preferably only provided on two opposing sides of the substrate 234, it is also within the terms of the present invention to form the substrate on all sides of the substrate. The skirt imparts additional strength and stiffness to the substrate 234. The stiffening effect of the skirt may permit a substantial reduction in the thickness of the substrate, i.e. as compared to the substrate 214 of FIG. 17, and thereby provide a source of cost reduction. The skirt 232 also enhances the thermal dissipation of the substrate by providing additional heat transfer surface to augment convective heat transfer to the environment.

Referring to FIG. 19, there is shown an embodiment of a hermetically sealed package 240 which is substantially identical with the package 230 except for additional cooling fins 242. These fins may be added to the bottom surface of the substrate 244 by joining a strip of preferably high thermal conductivity alloy such as alloy 151 in any conventional manner such as soldering. Although the fins 242 are illustrated as being formed from a strip of material bent into a substantially U-shaped configuration, it is also within the scope of the present invention to provide any number of these cooling fins formed from any number of strips of material and each being of any desirable shaped configuration.

FIG. 20 illustrates another embodiment of the present invention wherein a hermetically sealed package 250, substantially identical with the package 230 as shown in FIG. 18, is joined to a conventional printed circuit board 252 having a buried heat sink/ground plate 254 provided therein. The ground plate 254 may be made of any material which preferably has a high thermal and electrical conductivity. At least two holes or cavities 255 and 257 are provided and extend through one layer 266 to the heat plate 254 to permit the skirt 270 to protrude therein and contact the ground plate 254. The printed circuit board 252 includes through-holes 256 and 258 which may be plated with a material such as copper and which receive the ends of 260 and 262 of lead frame 264. The ends may be soldered in the through-holes and electrically connect outer foil layers 266 and 268. The skirt 270 is preferably joined by any desirable means, such as solder, to the heat sink/ground plate 254 to enhance the heat dissipation from the package 250.

FIG. 21 illustrates another embodiment of a hermetically sealed semiconductor package 280 with leads in accordance with the present invention. A dropped center substrate 282 having an indentation is provided by any means such as deep drawing the material of the substrate. A lead frame 283 is glass bonded to the inner surface of the indentation of the substrate. A substantially flat cover 284 may be hermetically sealed to the lead frame 283 whereby an enclosure 285 is formed to protect the chip 286. The chip is preferably affixed to a flat inner surface 287 of the bottom surface 289 of substrate 282. An open section or cavity 288 of the printed circuit board 290 receives the dropped center substrate. The bottom 289 of the substrate may be joined directly to a heat sink/ground plate 292 which is buried within the printed circuit board. The coefficient of thermal expansion of the substrate may be chosen to closely match that of the heat sink/ground plate which is preferably made of a good thermal conductor such as copper. Thus, difficulties which might arise out of a mismatch of the coefficient of thermal expansion and in particular due to the large joining area 289 are substantially eliminated.

Referring again to FIG. 21, a layer of moisture or contaminant absorbing material 300 may be placed upon the internal surface 301 of the lid 284 so as to scavenge water vapor and/or other contaminants which may diffuse into the package. This layer may consist of materials such as silica gel, activated carbon, etc., or mixtures of such materials. The material may be affixed by any conventional manner such as by an adhesive or placing the material in a container and affixing the container to the surface. Although this option is illustrated in FIG. 21, it may also be applied to any of the other embodiments of the invention as provided herein. Also, the absorbing material may be affixed to any inner surface as desired.

The patents, patent applications and publications set forth in this application are intended to be incorporated by reference herein.

It is apparent that there has been provided in accordance with this invention a composite, a semiconductor package, and a system of mounting the semiconductor package with the composite which satisfies the objects, means, and advantages set forth hereinabove. While the invention has been described in combination with the embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

I claim:

1. A semiconductor package for mounting a chip comprising:

a substrate member having inner and outer surfaces with sides disposed therebetween, said inner surface adapted for mounting the chip thereon;

a lead frame disposed adjacent to at least one side of said substrate, said lead frame comprised of inner and outer lead ends wherein said outer lead end extends outwardly from said outer surface of said substrate and said inner lead end is angularly displaced to extend along at least one side of said substrate;

a cover member having an indentation adapted to receive the chip;

means for bonding both said inner lead end of said lead frame to at least one side of said substrate and said outer lead end of said lead frame to said cover member.

2. The semiconductor package as in claim 1 wherein said means for bonding comprises a material selected from the group consisting of glass and ceramic having a coefficient thermal expansion of above about $127 \times 10^{-7}$ in/in/°C.

3. The semiconductor package as in claim 2 wherein said means for bonding has a coefficient of thermal expansion of at least about $160 \times 10^{-7}$ in/in/°C.

4. The semiconductor package as in claim 2 wherein said substrate member, lead frame and cover member comprise a material selected from the group consisting of metal and metal alloy.

5. The semiconductor package of claim 4 wherein said metal alloy comprises a copper alloy having a coefficient of thermal expansion of about $171 \times 10^{-7}$ in./in/°C. and contains an effective amount of up to 12% aluminum to form a refractory oxide and the balance essentially copper.

6. The semiconductor package as in claim 5 wherein said copper alloy consists essentially of 2.5 to 3.1% aluminum, 1.5 to 2.1% silicon and the balance essentially copper.

7. The semiconductor package as in claim 5 wherein said substrate member, said cover member and said lead frame have refractory oxide layers on at least one of their surfaces.

8. The semiconductor package as in claim 7 wherein said bonding material is bonded between said refractory oxide layers of said substrate and said lead frame and between said refractory oxide layers of said cover member and said lead frame, respectively.

9. The semiconductor package as in claim 8 further including:
said substrate member having a portion extending outwardly from said package;
a printed circuit board having first and second metal or metal alloy layers;
means for bonding said first and second layers together;
a cavity in said circuit board extending through one of said layers to the other of said layers; and
said semiconductor package being disposed in relation to said circuit board so that said lead frame is in contact with said one of said layers and said portion of said substrate member which extends from said package is disposed within said cavity and in contact with said other of said layers.

10. The semiconductor package as in claim 8 wherein said bonding material is selected from the group consisting of glass and ceramic.

* * * * *